(12) United States Patent
Om et al.

(10) Patent No.: US 8,106,448 B2
(45) Date of Patent: Jan. 31, 2012

(54) NAND FLASH MEMORY DEVICE

(75) Inventors: Jae Chul Om, Kyeongki-do (KR); Nam Kyeong Kim, Kyeongki-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/762,778

(22) Filed: Apr. 19, 2010

(65) Prior Publication Data

US 2010/0200902 A1 Aug. 12, 2010

Related U.S. Application Data

(62) Division of application No. 11/646,956, filed on Dec. 28, 2006, now Pat. No. 7,727,839.

(30) Foreign Application Priority Data

Jan. 2, 2006 (KR) ..................................... 2006-101

(51) Int. Cl.
*H01L 29/772* (2006.01)
(52) U.S. Cl. .................. 257/331; 257/334; 257/E29.262
(58) Field of Classification Search .................... 438/272
See application file for complete search history.

(56) References Cited

U.S. PATENT DOCUMENTS

| | | | |
|---|---|---|---|
| 7,456,466 B2* | 11/2008 | Om et al. ....................... | 257/315 |
| 7,547,943 B2 | 6/2009 | Cho et al. | |
| 7,795,643 B2* | 9/2010 | Sel et al. ....................... | 257/202 |
| 2002/0081806 A1 | 6/2002 | Shin et al. | |
| 2002/0182852 A1 | 12/2002 | Singh | |
| 2005/0023600 A1 | 2/2005 | Shin et al. | |
| 2005/0230738 A1 | 10/2005 | Lee | |
| 2006/0131636 A1 | 6/2006 | Jeon et al. | |
| 2006/0216890 A1 | 9/2006 | Ahn | |
| 2006/0273370 A1 | 12/2006 | Forbes | |
| 2007/0020846 A1 | 1/2007 | Nam | |

FOREIGN PATENT DOCUMENTS

| | | |
|---|---|---|
| JP | 04079370 A | 3/1992 |
| KR | 1020050106280 | 11/2005 |
| KR | 1020060076506 | 7/2006 |
| KR | 1020060081003 | 7/2006 |
| TW | 246188 B | 12/2005 |

OTHER PUBLICATIONS

Translation of First Office Action for corresponding Chinese Patent Application No. 200710001227.8, dated Aug. 15, 2008.

* cited by examiner

*Primary Examiner* — Stephen W Smoot

(74) *Attorney, Agent, or Firm* — Marshall, Gerstein & Borun LLP

(57) ABSTRACT

A method of manufacturing a NAND flash memory device. A semiconductor substrate of a portion in which a source select line SSL and a drain select line DSL will be formed is recessed selectively or entirely to a predetermined depth. Accordingly, the channel length of a gate can be increased and disturbance can be reduced. It is therefore possible to improve the reliability and yield of devices.

5 Claims, 7 Drawing Sheets

NAND FLASH MEMORY DEVICE

CROSS-REFERENCE TO RELATED APPLICATIONS

This is a division of U.S. application Ser. No. 11/646,956 filed Dec. 28, 2006, now U.S. Pat. No. 7,727,839, which claims the priority benefit under USC 119 of KR 10-2006-101 filed Jan. 2, 2006, the entire respective disclosures of which are incorporated herein by reference.

BACKGROUND

1. Field of the Invention

The invention relates, in general, to a method of manufacturing a NAND flash memory device and, more particularly, to a method of manufacturing a NAND flash memory device, wherein program disturbance can be improved.

2. Discussion of Related Art

A NAND flash memory has a string structure in which source select line (SSL) and drain select line (DSL) gates and 16 to 64 cell gates are arranged in series between a source line and a bit line. The source select line (SSL) and drain select line (DSL) gates are generally greater than the cell gates. The number of cell gates arranged in the first string is generally 32 due to the limit of a cell current.

The cell program of the flash memory device is performed in such a manner that a voltage of 15V to 20V is applied to a selected cell gate and a pass voltage (Vpass) of about 10V is applied to a non-selected cell gate so that carriers introduced into the bit line pass through the tunnel oxide layer of the selected cell gate and charge the floating gate.

In general, the NAND flash memory device employs a method of applying 0V to the bit line in order to improve the charge efficiency of a selected channel and self-boosting a non-selected channel in order to prohibit program disturbance.

If the level of integration increases and the gate design rules are complicated, however, GIDL (gate induced drain leakage) is generated at the drain of the drain select line DSL or the source select line SSL of a non-selected cell string at the time of the self-boosting operation. Accordingly, program disturbance occurs in which unwanted electrons are injected into neighboring memory cells and the cells are programmed. This results in an abrupt decrease in the reliability and yield of devices.

If the distance between the source select line SSL and the drain select line DSL and neighboring memory cells is sufficiently secured, program disturbance can be controlled up to 90 nm. It is, however, to difficult to secure a sufficient distance as the level of integration is increased. To solve the problem, a method of reducing the size of the drain select line DSL and the source select line SSL has been proposed.

If the size of the source select line SSL is reduced, however, a punch-off leakage current is caused between a boosting channel of a non-selected bit line and a common source at the time of program. This causes to lower the channel boosting level, leading to aggravated program disturbance.

Furthermore, if the size of the drain select line DSL is reduced, the threshold voltage Vt of the drain select transistor is lowered. Accordingly, the channel precharge voltage level is lowered and the boosting level is lowered, resulting in aggravated program disturbance.

SUMMARY OF THE INVENTION

In one embodiment, the invention relates to a method of manufacturing a NAND flash memory device, in which a semiconductor substrate of a source select line SSL, a drain select line DSL, a source line, and a bit line are recessed to a predetermined depth selectively or entirely, thus increasing the effective channel length of a gate and also reducing program disturbance.

According to one aspect, the invention provides a method of manufacturing a NAND flash memory device, including the step of recessing a portion in which a source select line and a drain select line of a semiconductor substrate will be formed selectively or entirely to a predetermined depth.

According to another aspect, the invention provides a method of manufacturing a NAND flash memory device, including the steps of recessing a portion in which a source select line and a drain select line of a semiconductor substrate will be formed and then performing annealing, depositing a tunnel oxide layer, a capping polysilicon layer, and a first hard mask layer on the recessed semiconductor substrate to a predetermined thickness, and then etching predetermined regions to form trenches, depositing a first insulating layer on the entire surface so that the trenches are buried, and stripping the first insulating layer to expose a top surface of the first hard mask layer, thereby forming isolation layers, and depositing a first polysilicon layer on the entire surface and then etching predetermined regions.

According to still another aspect, the invention provides a method of manufacturing a NAND flash memory device, including the steps of etching predetermined regions of a semiconductor substrate to form trenches, and then depositing a first insulating layer on the entire surface so that the trenches are buried, stripping the first insulating layer to expose a top surface of the semiconductor substrate, forming isolation layers, recessing a portion in which a source select line and a drain select line of the semiconductor substrate will be formed and then performing annealing, and depositing a tunnel oxide layer and a first polysilicon layer on the entire surface and then etching predetermined regions of the first polysilicon layer and the tunnel oxide layer so that a top surface of the isolation layers is exposed.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

The invention will now be described in detail in connection with certain exemplary embodiments with reference to the accompanying drawings.

Figure 1:
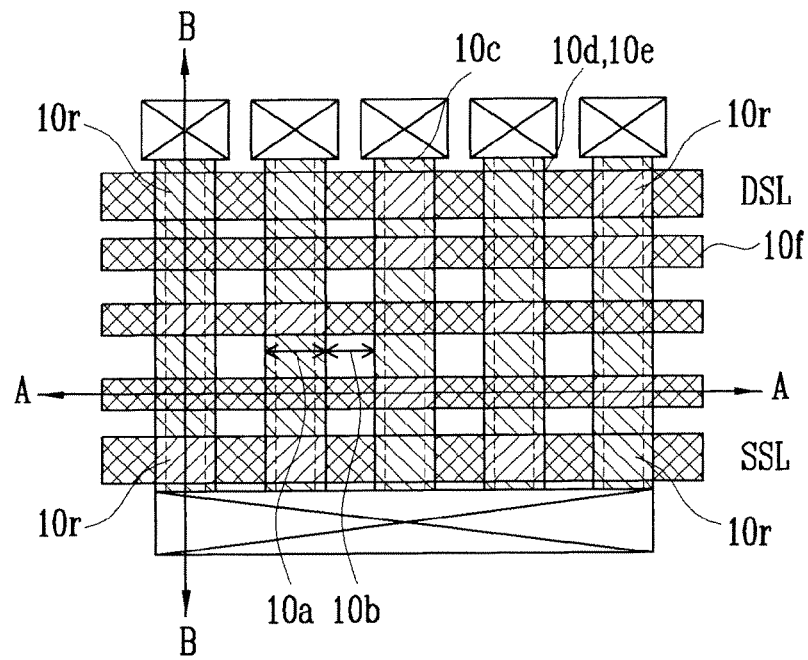
FIG. 1 is a layout diagram illustrating a method of manufacturing a NAND flash memory device employing self-aligned STI (shallow trench isolation) according to a first embodiment of the invention.

FIG. 1 is a layout diagram illustrating a method of manufacturing a NAND flash memory device employing self-aligned STI according to a first embodiment of the invention.

A portion in which a source select line SSL and a drain select line DSL of a semiconductor substrate will be formed is recessed (indicated by 10r) to a predetermined thickness. Active regions 10a and field regions 10b are defined by isolation layers formed in predetermined regions of the semiconductor substrate.

First polysilicon layers 10c are formed in the active regions 10a, and second polysilicon layers 10d are formed on the first polysilicon layers 10c to overlap with the field regions 10b. Dielectric layers 10e are formed on the second polysilicon layers 10d. A control gate 10f is defined to cross the active regions 10a and the field regions 10b. The first polysilicon layers 10c and the second polysilicon layers 10d are patterned using the control gate 10f as a mask, thus forming a floating gate.

FIGS. 2A to 2F are cross-sectional views of the NAND flash memory device taken along line A-A in FIG. 1, and FIGS. 3A to 3F are cross-sectional views of the NAND flash memory device taken along line B-B in FIG. 1.

Figure 2A:
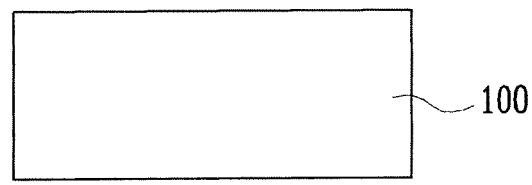
FIGS. 2A to 2F are cross-sectional views of the NAND flash memory device taken along line A-A in FIG. 1.
Figure 3A:
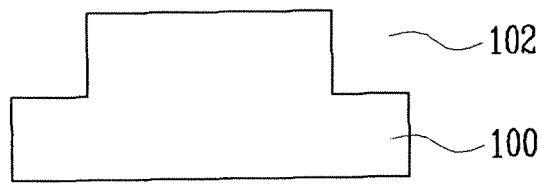
FIGS. 3A to 3F are cross-sectional views of the NAND flash memory device taken along line B-B in FIG. 1.

Referring to FIGS. 2A and 3A, to increase the threshold voltage Vt of the source select line SSL and the drain select line DSL, an ion implantation process is performed on the portion in which the source select line SSL and the drain select line DSL of a semiconductor substrate 100 will be formed. Accordingly, the threshold voltage Vt of the source select line SSL and the drain select line DSL becomes higher than the threshold voltage Vt of a cell.

A mask (not shown) is formed at a predetermined region on the semiconductor substrate 100. The portion in which the source select line SSL and the drain select line DSL of the semiconductor substrate 100 will be formed is recessed (indicated by "102" in FIG. 3A) using the mask. The recess 102 may be formed by using a mixed gas in which additive gases, such as HBr, Ar, and He, for example, are added to $Cl_2$ and plasma energy of 100 W to 3 KW, for example. The recessed regions are formed only at the portions in which the source select line SSL and the drain select line DSL will be formed. Accordingly, they are not shown in FIG. 2A, but are shown only in FIG. 3A.

In this case, at the time of the recess (102) process, the semiconductor substrate 100 is damaged. To restore the damaged semiconductor substrate 100, annealing may be performed in a furnace at a low booting temperature of 850° C. to 1500° C., for example.

Figure 2B:
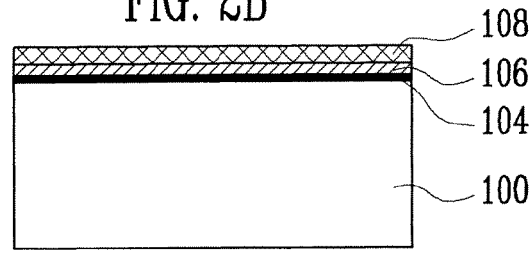
Figure 3B:
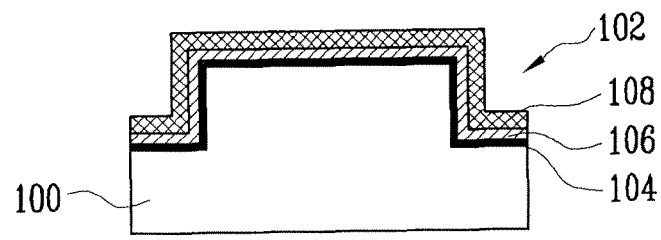

Referring to FIGS. 2B and 3B, a tunnel oxide layer 104, a capping polysilicon layer 106, and a first hard mask layer 108 are sequentially formed on the recessed semiconductor substrate 100.

Figure 2C:
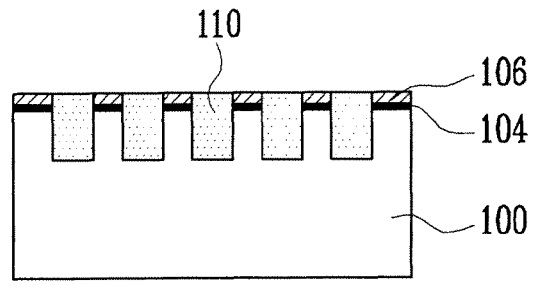
Figure 3C:
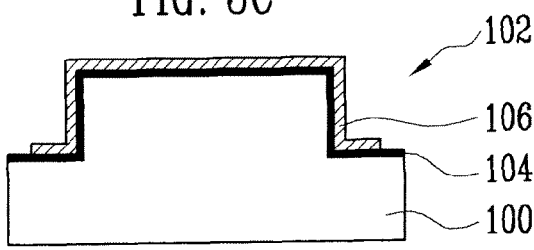

Referring to FIGS. 2C and 3C, predetermined regions of the first hard mask layer 108 and the capping polysilicon layer 106 are etched. Portions of the tunnel oxide layer 104 and the semiconductor substrate 100 are etched using the first hard mask layer 108 and the capping polysilicon layer 106 as masks, forming trenches (not shown).

A first insulating layer is deposited on the entire surface so that the trenches are buried. The first insulating layer may preferably be formed to a thickness of 300 Å to 10000 Å using a single layer, such as HDP (high density plasma), BPSG (boro-phosphorous silcate glass) or SOG (spin on glass), for example, or a stack layer of the HDP, BPSG, and SOG.

The first insulating layer is then stripped to exposed a top surface of the first hard mask layer 108. The process of stripping the first insulating layer may preferably use CMP (chemical mechanical polishing) or etch back. The first hard mask layer 108 is stripped using a liquefied chemical to form isolation layers 110 (seen in FIG. 2C) having a nipple. Accordingly, the field regions A and the active regions B are defined. The isolation layers 110 are formed in the field regions and are not shown in FIG. 3C accordingly.

Figure 2D:
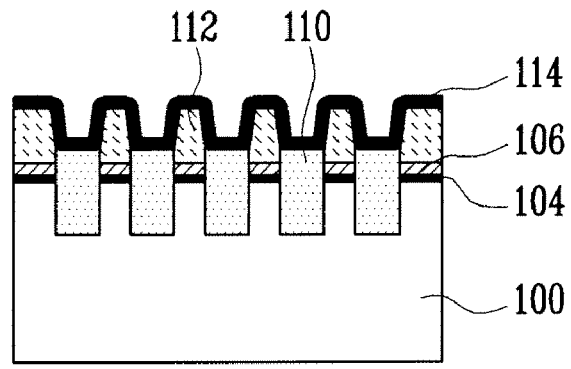
Figure 3D:
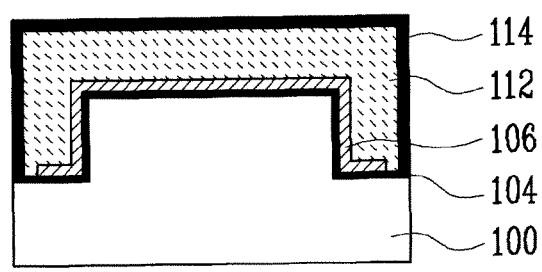

Referring to FIGS. 2D and 3D, a first polysilicon layer 112 is deposited on the entire surface. A predetermined region of the first polysilicon layer 112 is etched. An IPO (inter-poly oxide) dielectric layer 114 is deposited on the entire surface. The dielectric layer 114 may be an ONO layer.

Figure 2E:
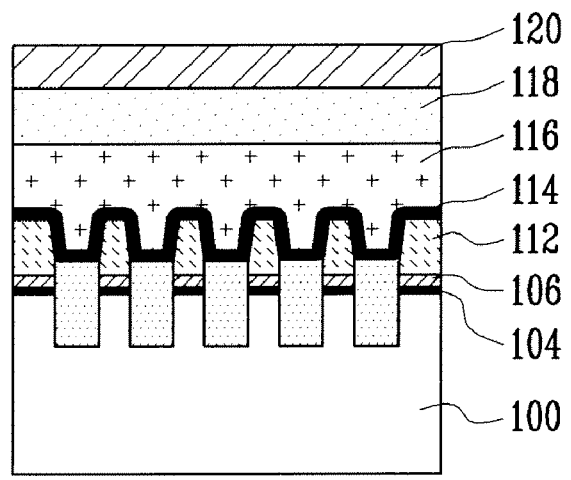
Figure 3E:
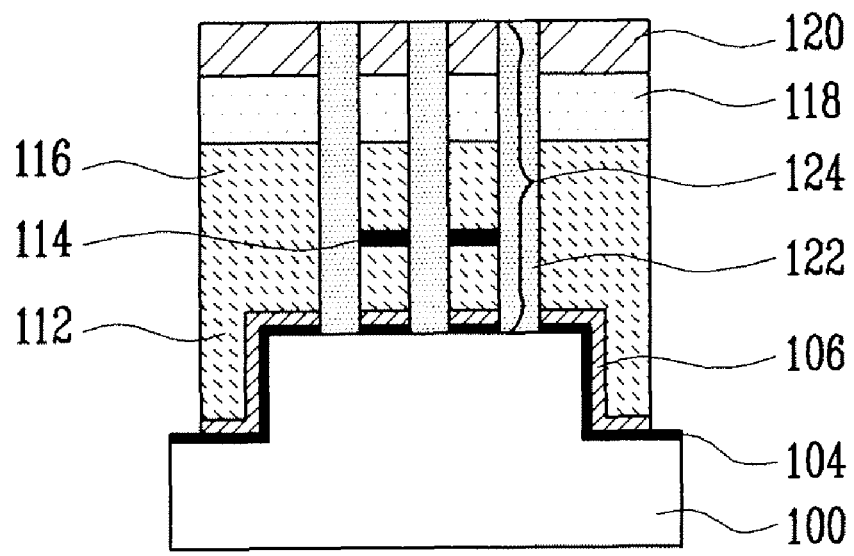

Referring to FIGS. 2E and 3E, a predetermined region of the dielectric layer 114 formed in the source select line (SSL) and the drain select line (DSL) regions is stripped. The dielectric layer 114 is stripped by dry etch. This is because if the dielectric layer 114 is stripped by wet etch, gates next to the gates of the source select line SSL and the drain select line DSL may be attacked and the controllability of the process may become low.

A conductive layer for a control gate is formed on the entire surface, forming a control gate. It is preferred that the conductive layer for the control gate is formed by depositing a second polysilicon layer 116, a tungsten layer or a tungsten silicide film 118, and a second hard mask layer 120 and etching the second polysilicon layer 116, the tungsten layer or the tungsten silicide film 118, and the second hard mask layer 120 so that the conductive layer consists of the tungsten layer or the tungsten silicide film 118 and the second polysilicon layer 116.

The dielectric layer 114, the first polysilicon layer 112, the capping polysilicon layer 106, and the tunnel oxide layer 104 are etched using the control gate as a mask, forming a floating gate comprising the polysilicon layers 112 and 106. A gate 122 having the floating gate, the dielectric layer 114, and the control gate is thereby completed.

A second insulating layer is deposited to bury between the gate 122 and the gate 122. The second insulating layer is etched to form a spacer 124 on the sidewall of the gate 122.

Figure 2F:
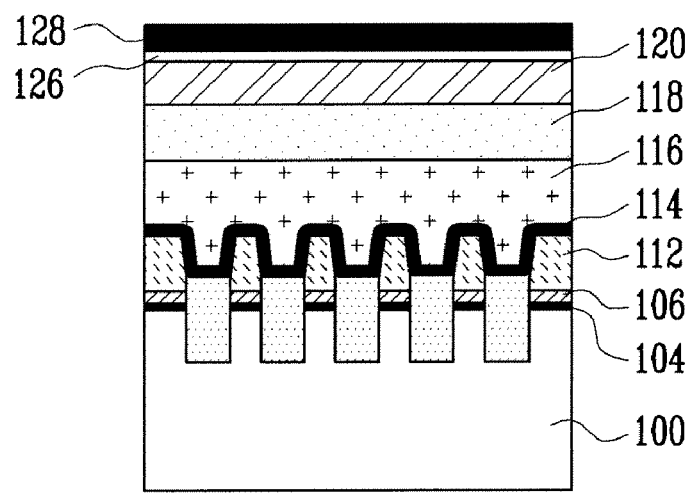
Figure 3F:
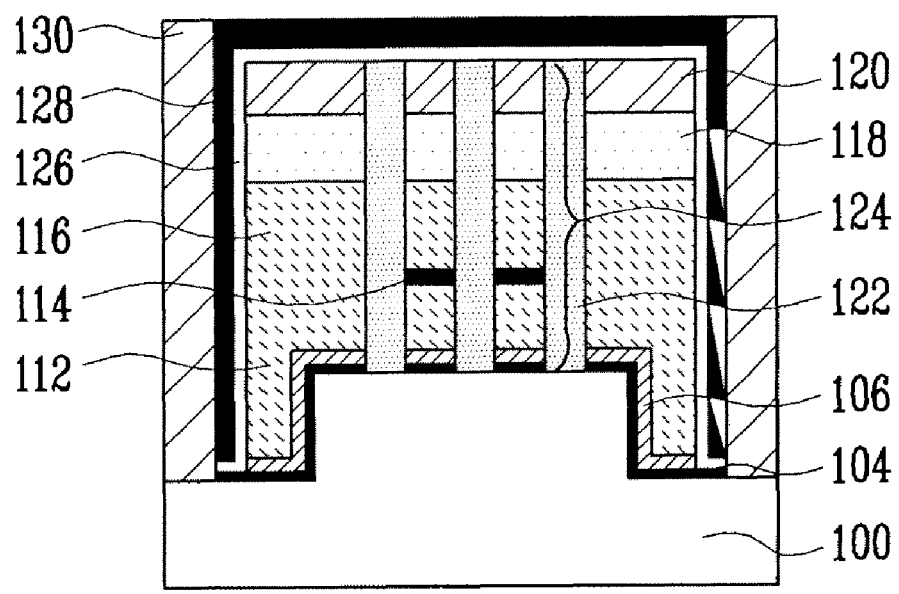

Referring to FIGS. 2F and 3F, a buffer oxide layer 126 and a third insulating layer 128 are deposited on the entire surface. The buffer oxide layer 126 and the third insulating layer 128 undergo dry etch, thus exposing a region in which a source line contact will be formed. The third insulating layer 128 may preferably be formed using a nitride layer at a temperature of 250° C. to 900° C. by means of LP-CVD (low pressure chemical vapor deposition) or PE-CVD (plasma enhanced chemical vapor deposition).

The exposed region is buried and then polished, thus forming plugs 130 (FIG. 3F). The plugs 130 may preferably be formed using polysilicon, tungsten, tungsten nitride or barrier metal (for example, Ti, TiN, CoSi, or Ta).

A channel length can be increased by recessing (indicated by "102") the portion in which the source select line SSL and the drain select line DSL of the semiconductor substrate 100 will be formed to a predetermined thickness as described above. Accordingly, the channel of a cell that has not been programmed is precharged to Vcc (the power supply voltage)–Vt (the threshold voltage) and is then increased by the self-boosting operation. It is therefore possible to reduce a voltage difference between the gate of the cell and the channel and also to prevent the program disturbance phenomenon in which the cell is programmed.

Figure 4:
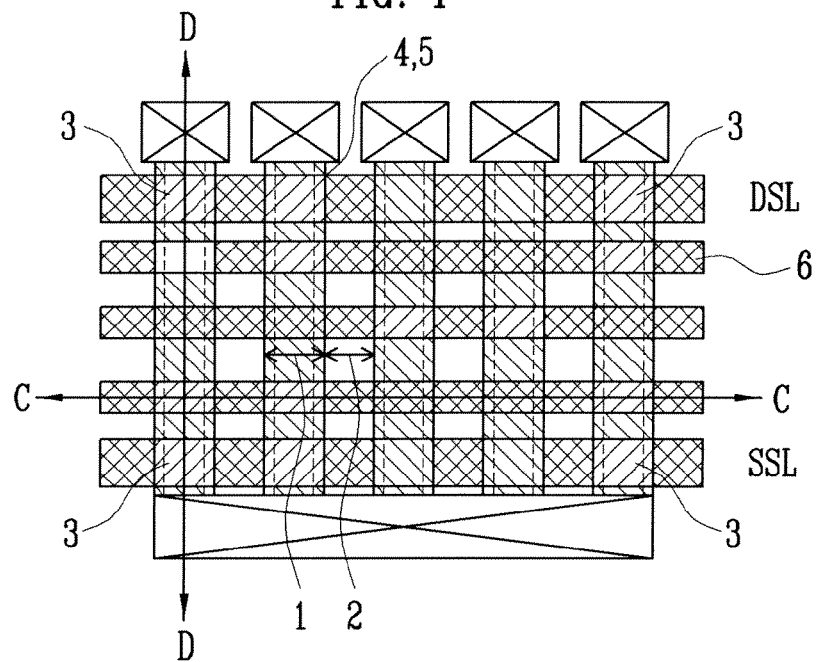
FIG. 4 is a layout diagram illustrating a method of manufacturing a NAND flash memory device employing common STI according to a second embodiment of the invention.

FIG. 4 is a layout diagram illustrating a method of manufacturing a NAND flash memory device employing common STI according to a second embodiment of the invention.

Referring to FIG. 4, active regions 1 and field regions 2 are defined by isolation layers formed in predetermined regions of a semiconductor substrate. Portions in which a source select line SSL and a drain select line DSL of the semiconductor substrate will be formed are recessed (indicated by "3") to a predetermined thickness.

A first polysilicon layer 4 is formed in the active region 1 and a dielectric layer 5 is formed on the first polysilicon layer 4. A control gate 6 is defined to cross the active regions 1 and the field regions 2. The first polysilicon layer 4 is patterned using the control gate 6 as a mask, thereby forming a floating gate.

FIGS. 5A to 5E are cross-sectional views of the NAND flash memory device taken along line C-C in FIG. 4, and FIGS. 6A to 6E are cross-sectional views of the NAND flash memory device taken along line D-D in FIG. 4.

Figure 5A:
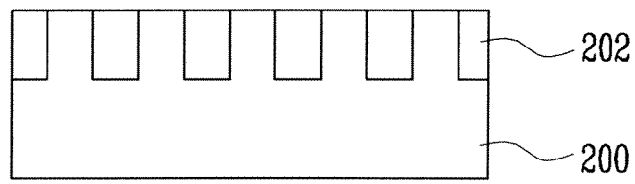
FIGS. 5A to 5E are cross-sectional views of the NAND flash memory device taken along line C-C in FIG. 4.
Figure 6A:
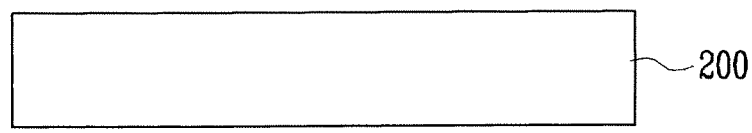
FIGS. 6A to 6E are cross-sectional views of the NAND flash memory device taken along line D-D in FIG. 4.

Referring to FIGS. 5A and 6A, a portion of a semiconductor substrate 200 is etched to form trenches (not shown). A first insulating layer is deposited on the entire surface so that the trenches are buried. The first insulating layer may preferably be formed to a thickness of 300 Å to 10000 Å by using HDP, BPSG, or SOG, for example.

The first insulating layer is then stripped to expose a top surface of the semiconductor substrate 200, thus forming isolation layers 202 (FIG. 5A). Accordingly, the field regions 1 and the active regions 2 are defined. The strip process of the first insulating layer may preferably be performed using CMP or etch-back, for example.

Figure 5B:
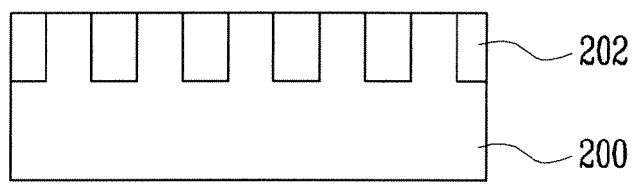
Figure 6B:
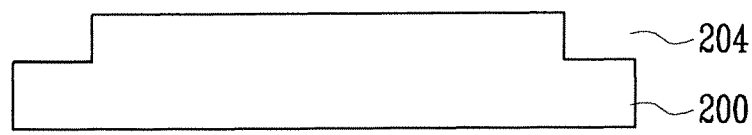

Referring to FIGS. 5B and 6B, to increase the threshold voltage Vt of the source select line SSL and the drain select line DSL, an ion implantation process is performed on the portions in which the source select line SSL and the drain select line DSL of the semiconductor substrate 200 will be formed. Accordingly, the threshold voltage Vt of the source select line SSL and the drain select line DSL becomes higher than the threshold voltage Vt of a cell.

A mask (not shown) is formed at a predetermined region on the semiconductor substrate 200. The portion in which the source select line SSL and the drain select line DSL of the semiconductor substrate 200 will be formed is recessed (indicated by "204" in FIG. 6B) using the mask. The recess 204 may be preferably formed by using a mixed gas in which additive gases, such as HBr, Ar and He, are added to $Cl_2$ and plasma energy of 100 W to 3 KW, for example. The recessed regions are formed only at the portion in which the source select line SSL and the drain select line DSL will be formed. Accordingly, they are not shown in FIG. 5B, but are shown only in FIG. 6B.

In this case, at the time of the recess (204) process, the semiconductor substrate 200 is damaged. To restore the damaged semiconductor substrate 200, annealing may preferably be performed in a furnace at a low booting temperature of 850° C. to 1500° C.

Figure 5C:
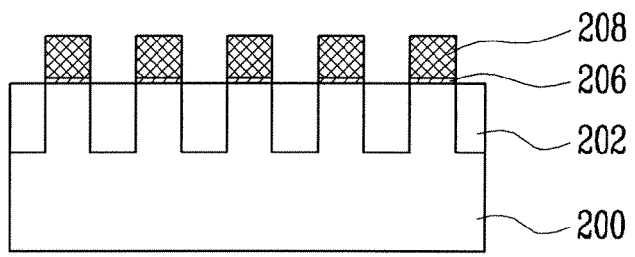
Figure 6C:
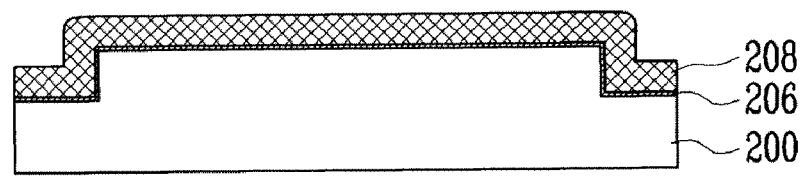

Referring to FIGS. 5C and 6C, a tunnel oxide layer 206 and a first polysilicon layer 208 are deposited on the entire surface. Predetermined regions of the first polysilicon layer 208 and the tunnel oxide layer 206 are stripped so that a top surface of the isolation layers 202 is exposed.

Figure 5D:
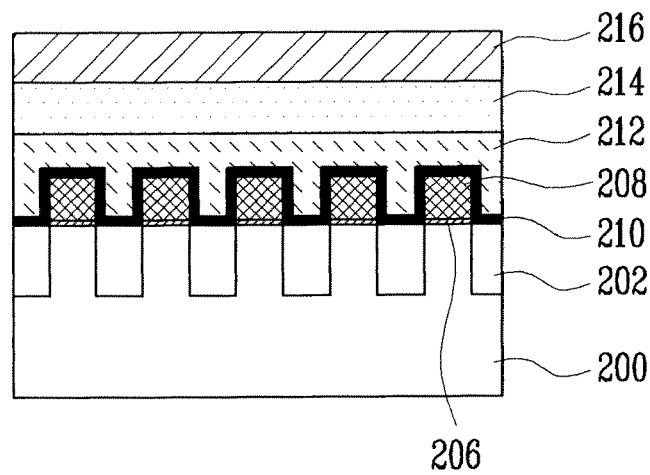
Figure 6D:
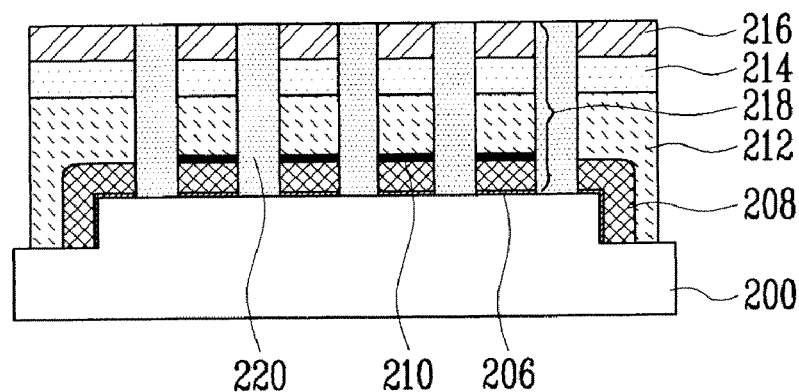

Referring to FIGS. 5D and 6D, an IPO dielectric layer 210 is deposited on the entire surface. The dielectric layer 210 may preferably be an ONO layer. A predetermined region of the dielectric layer 210 formed in the source select line (SSL) and the drain select line (DSL) regions is stripped. The dielectric layer 210 is stripped by dry etch. If the dielectric layer 210 is stripped by wet etch, gates next to the gates of the source select line SSL and the drain select line DSL may be attacked and the controllability of the process may become low.

A second polysilicon layer 212, a tungsten layer or a tungsten silicide film 214, and a hard mask layer 216 are deposited on the entire surface. The second polysilicon layer 212, the tungsten layer or the tungsten silicide film 214, and the hard mask layer 216 are etched to form a control gate having the tungsten layer or the tungsten silicide film 214 and the second polysilicon layer 212.

The dielectric layer 210, the first polysilicon layer 208, and the tunnel oxide layer 206 are etched using the control gate as a mask, forming a floating gate having the polysilicon layer 208. A gate 218 comprising the floating gate, the dielectric layer 210, and the control gate is thereby formed.

A second insulating layer is deposited to bury between the gate 218 and the gate 218. The second insulating layer is etched to form a spacer 220 on the sidewall of the gate 218.

Figure 5E:
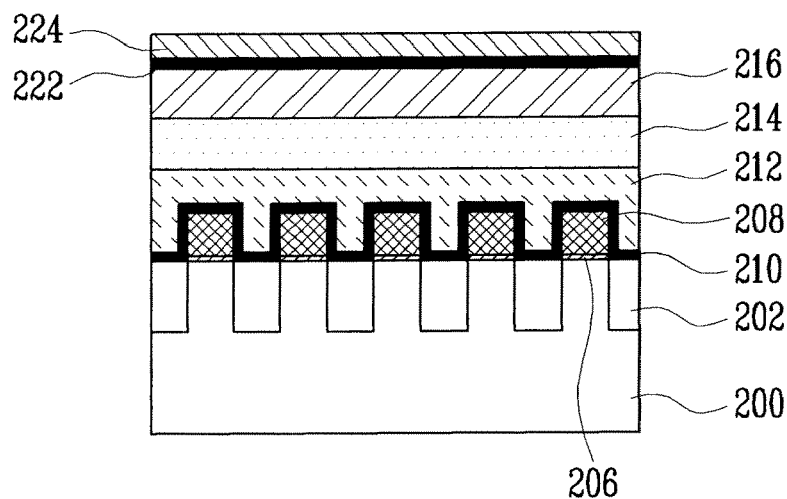
Figure 6E:
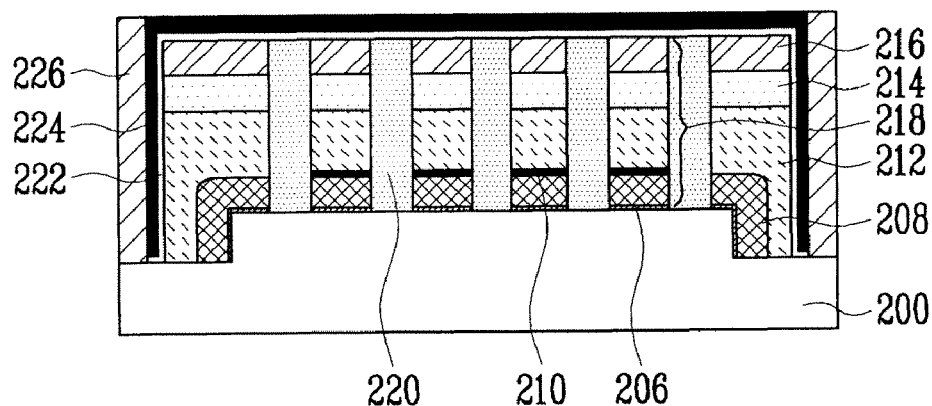

Referring to FIGS. 5E and 6E, a buffer oxide layer 222 and a third insulating layer 224 are deposited on the entire surface. The buffer oxide layer 222 and the third insulating layer 224 undergo dry etch, thus exposing a region in which a source line contact will be formed. The third insulating layer 224 may preferably be formed using a nitride layer at a temperature of 250° C. to 900° C. by means of LP-CVD or PE-CVD, for example.

The exposed region is buried and then polished, thus forming plugs 226. The plugs 226 may preferably be formed using polysilicon, tungsten, tungsten nitride or barrier metal (for example, Ti, TiN, CoSi, or Ta).

The channel length can be increased by recessing (204) the portion in which the source select line SSL and the drain select line DSL of the semiconductor substrate 200 will be formed to a predetermined thickness as described above. Accordingly, the channel of a cell that has not been programmed is precharged to Vcc–Vt and is then increased by the self-boosting operation. It is therefore possible to reduce a voltage difference between the gate of the cell and the channel and also to prevent the program disturbance phenomenon in which the cell is programmed.

As described above, according to the invention, a portion in which the source select line SSL and the drain select line DSL will be formed is recessed to a predetermined thickness. Accordingly, the channel length can be increased. Due to this, the channel of a cell that has not been programmed is precharged to Vcc–Vt and is increased by the self-boosting operation. Therefore, the program disturbance phenomenon in which a voltage difference between the gate of a cell and the channel abruptly reduces and the cell is thus programmed can be prevented. Furthermore, the reliability and yield of devices can be improved.

While the invention has been described in connection with practical exemplary embodiments, the invention is not limited to the disclosed embodiments but, to the contrary, is intended to cover various modifications and equivalent arrangements included within the spirit and scope of the appended claims.

What is claimed is:

1. A NAND flash memory device, comprising:
   a semiconductor substrate having recessed portions formed on both sides of the semiconductor substrate, wherein each of the recessed portions has a first edge and a second edge;
   cell gates formed on the semiconductor substrate;
   a source select gate respectively formed on the first edge of the respective recessed portions; and
   a drain select gate respectively formed on the second edge of the respective recessed portions,
   wherein a portion of the source select gate and a portion of the drain select gate are formed on the semiconductor substrate, and the other portion of the source select gate and the other portion of the drain select gate are formed on the recessed portion.

2. The NAND flash memory device of claim 1, wherein the substrate of the source select gate and the drain select gate have a step.

3. The NAND flash memory device of claim 2, wherein a region where the step is formed is in a direction that is not adjacent to a word line.

4. A NAND flash memory device, comprising:
- a semiconductor substrate having a first region, a second region and a third region, in which recesses are formed in the first and third region;
- a source select gate formed on an edge of the first region and a portion of the second region;
- cell gates formed on the second region;
- a drain select gate formed on an edge of the third region and a portion of the second region, and
- wherein the substrate of the source select gate and the drain select gate have a step.

5. The NAND flash memory device of claim 4, wherein a region where the step is formed is in a direction that is not adjacent to a word line.

* * * * *